US007236919B2

(12) United States Patent
Fulkerson

(10) Patent No.: US 7,236,919 B2
(45) Date of Patent: Jun. 26, 2007

(54) METHOD FOR USING LAYOUT REGIONS TO PREDICT SINGLE-EVENT EFFECTS

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 92 days.

(21) Appl. No.: 11/200,414

(22) Filed: Aug. 8, 2005

(65) Prior Publication Data

US 2007/0033559 A1 Feb. 8, 2007

Related U.S. Application Data

(60) Provisional application No. 60/697,830, filed on Jul. 8, 2005.

(51) Int. Cl.
G06F 17/50 (2006.01)
G06F 7/62 (2006.01)
(52) U.S. Cl. .......................................... 703/16; 703/17
(58) Field of Classification Search .................. 703/16, 703/17
See application file for complete search history.

(56) References Cited

U.S. PATENT DOCUMENTS 5,949,694 A * 9/1999 Amerasekera et al. ......... 716/5

OTHER PUBLICATIONS

David E. Fulkerson, "SPICE Model for SEU Effects in an SOI Process," 2004 Single Event Effects Symposium, Apr. 28, 2004.
Barnes et al., "Chapter 10. Radiation Effects in MMIC Devices,"
Barnes et al., "Chapter 10. Radiation Effects in MMIC Devices," GaAs MMIC Reliabililty Assurance Guideline, Dec. 15, 1996.
Dodd et al., "Epi, Thinned, and SOI Substrates: Cure-Alls or Just Lesser Evils?," Sandia National Laboratories, Albuquerque, NM.
J.F. Ziegler, "Trends in Electronic Reliability—Effects of Terrestrial Cosmic Rays," http://www.srim.org/SER/SERTrends.htm, printed Jul. 14, 2006.
D & R Headline News, "iRoC Technologies Introduces SERPRO Services for Transistor-level Soft Error Rate Analysis and Optimization," Oct. 6, 2004.
G. R. Srinivasan, "Modeling the Cosmic-Ray-Induced Soft-Error Rate in Integrated Circuits: An Overview," IMB J. Res. Develop. vol. 40, No. 1, Jan. 1996.
Zhang et al., "FASER: Fast Analysis of Soft Error Susceptibility for Cell-Based Designs," Department of Electrical and Computer Engineering, University of Texas.

(Continued)

Primary Examiner—Evan Pert
(74) Attorney, Agent, or Firm—McDonnell Boehnen Hulbert & Berghoff LLP

(57) ABSTRACT

A method for modeling a circuit layout to determine behavior responsive to a radiation event is set forth. The method includes identifying a first portion of the circuit layout that includes at least one body region of a MOS transistor in the circuit layout, the at least one region having a width substantially equal to that of the MOS transistor. A first model corresponding to the first portion of the circuit layout is selected. A second portion of the circuit layout that includes at least a first region within a drain of the MOS transistor in the circuit layout is identified and an appropriate second model corresponding to the second portion of the circuit layout is selected, wherein the at least one second model includes at least one parasitic bipolar transistor.

6 Claims, 2 Drawing Sheets

OTHER PUBLICATIONS

Tylka et al., "Single Event Upsets Caused by Solar Energetic Heavy IONS," IEEE Transactions on Nuclear Science, vol. 43, No. 6, pp. 2758-2766, Dec. 1996.

Tylka et al., "CREME96: A Revision of the cosmic Ray Effects on Micro-Electronics Code," IEEE Transactions on Nuclear Science, vol. 44, No. 6, Dec. 1997.

Fulkerson et al., "Prediction of SOI Single-Event Effects Using a Simple Physics-Based SPICE Model," IEEE Transactions on Nuclear Science, vol. 52, No. 6, Dec. 2005.

"Single Event Effects Symposium" Apr. 27-29, 2004, Manhattan Beach, CA. http://radhome.gsfc.nasa.gov/radhome/SEE/page4.html.

* cited by examiner

METHOD FOR USING LAYOUT REGIONS TO PREDICT SINGLE-EVENT EFFECTS

CROSS REFERENCE TO RELATED APPLICATIONS

The present application claims priority to the following US filed provisional patent application: U.S. 60/697,830, filed Jul. 8, 2005, which is Incorporated herein by reference;

FIELD

The present invention relates generally to circuit modeling, and more particularly, to predicting single event effects in semiconductor devices.

BACKGROUND

A Single Event Effect (SEE) is a disturbance in an active electronic device caused by a single, energetic particle. One type of SEE is a Single Event Upset (SEU). An SEU is a radiation-induced error in a semiconductor device caused when a charged particle loses energy by ionizing the medium through which it passes, leaving behind a wake of electron-hole pairs, forming a parasitic conduction path. The parasitic conduction path causes a false transition on a node. The false transition, or glitch, propagates through the semiconductor device and ultimately results in the disturbance of a node containing state information, such as an output of a latch or register.

Typically, an SEU is caused by ionizing radiation components in the atmosphere, such as neutrons, protons, and heavy ions. The ionizing radiation components are abundant in space, even at commercial flight altitudes. Additionally, an SEU can be caused by alpha particles from the decay of trace concentrations of uranium and thorium present in some integrated circuit packaging. As another example, an SEU may be caused by a detonated nuclear weapon. When a nuclear bomb is detonated, intense fluxes of gamma rays, x-rays, and other high energy particles are created.

Some semiconductor devices are designed to operate in conditions that expose the devices to energetic particles. However, external testing to determine which semiconductor devices can withstand SEU is costly and time consuming. Therefore, it would be beneficial to be able to analyze and predict which semiconductor devices are suitable for operating in these conditions prior to performing external testing. As a result of being able to analyze and predict which semiconductor devices are suitable for operating in the presence of energetic particles, design and testing costs may be reduced.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

A simulation model may be used in conjunction with a circuit simulation software package to predict a semiconductor device's response to a particle strike. SPICE (and its variations) is one of the most common circuit simulation programs; however, other circuit simulation programs may be used, including a custom simulation program. The results of the simulation may be used to determine the device's susceptibility to natural and/or manmade high-energy ions.

Figure 1:
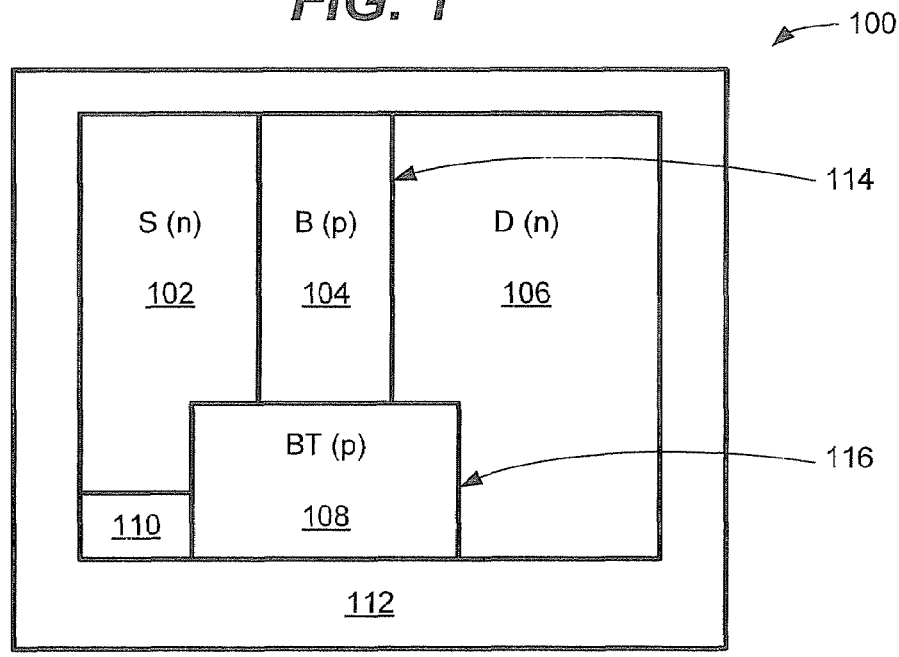
FIG. 1 shows a layout of a typical MOS transistor.

FIG. 1 is a diagram of a layout for a Metal Oxide Semiconductor (MOS) transistor 100. The MOS transistor 100 would likely be only one of many MOS transistors in a circuit. For example, the MOS transistor 100 could be part of a memory comprising a large number of memory cells, with each memory cell having its own MOS transistors (e.g. six MOS transistors). For simplicity and purposes of illustration, the simulation model set forth herein is for a single MOS transistor. The model can be expanded to include additional transistors by applying the disclosed concepts to additional transistors and considering each of the simulation results for the individual transistors in a memory cell or other circuit unit.

The layout for the MOS transistor 100 includes portions for a source 102, a body 104 (region generally under the gate of the MOS transistor 100), a drain 106, and body tie 108. Additionally shown in FIG. 1 are a contact 110 and oxide zone 112, which could serve as a separator between MOS transistors of different types (e.g. p-type and n-type).

Layouts typically may be chosen to economize wafer space and to realize high operating speeds by avoiding long trace lengths, for example. Another consideration in designing a layout, however, is to avoid making a circuit susceptible to Single Event Effects (SEE). See the Background section for a discussion of SEEs and Single Event Upsets (SEUs). The following discussion illustrates one embodiment for modeling the layout of the MOS transistor 100 to determine behavior responsive to a radiation event. The circuit layout may be changed based on the determined behavior, to avoid making the circuit susceptible to SEEs.

Figure 2:
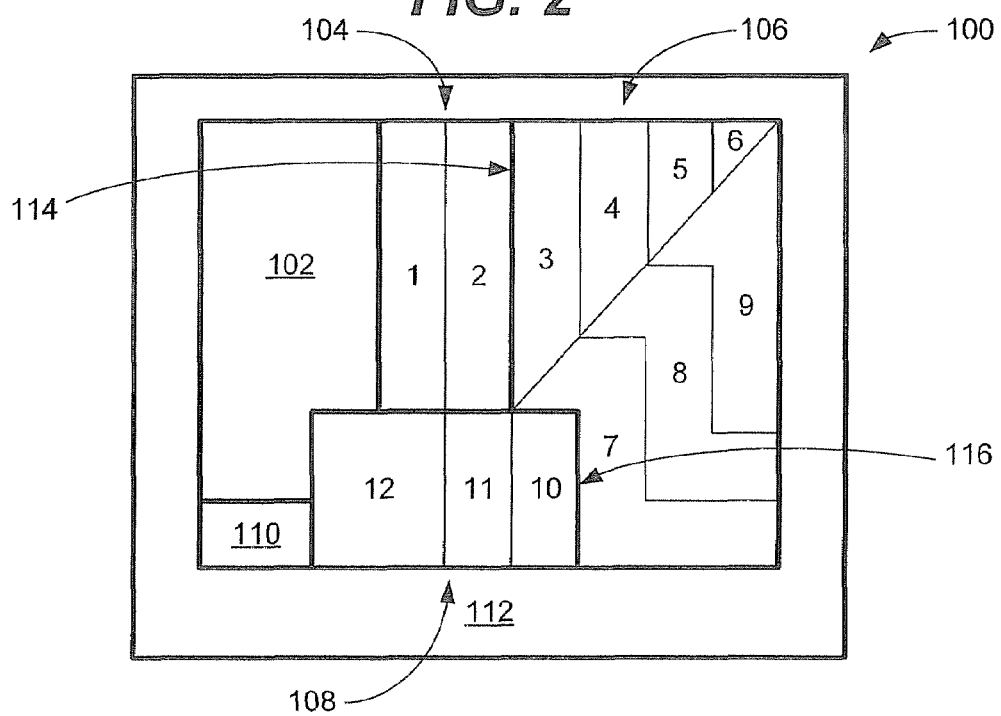
FIG. 2 shows the layout of FIG. 1, broken into regions of differing SEE sensitivity.

FIG. 2 is a diagram of a layout for the MOS transistor 100, showing regions that may be chosen to model differing SEE sensitivities in various portions of the layout of the MOS transistor 100. Each region has its own electrical behavior due to an ion impacting it.

The source 102 does not have a region assigned to it, as any photocurrent resulting from an ion strike is likely to discharge to ground.

The body 104 has two regions assigned to it, including region 1 and region 2. These two regions run substantially the width of the MOS transistor 100. At least one of the regions 1 and 2 could be modeled using a parasitic bipolar transistor. While two body regions 1 and 2 were identified in FIG. 2, fewer or more than two regions could be identified instead.

The drain 106 has regions 3–6 and 7–9 assigned to it. While all of the regions 3–9 are drain regions, their varying distances from the body portion 104 results in different sensitivities to a particle strike. Regions 3–6 are in a portion of the drain 106 that is generally closer to the body 104 than corresponding regions 7–9. The regions are roughly divided by a line that splits the drain from where the body 104, drain 106, and body tie 108 meet to a corner of the drain 106 opposite the body tie 108. This dividing line is based on the relative distances of potential ion strikes to the various junctions in the MOS transistor 100. For example, the junctions include at least a body-drain junction 114 and a body tie-drain junction 116. An ion strike in any of regions 3–6 will result in a charge cloud that quickly expands, hitting the body-drain junction 114 before the body tie-drain junction 116. Conversely, an ion strike in any of regions 7–9 would be closer to the body tie-drain junction 116 than to the body-drain junction 114. The models selected to correspond to these regions are preferably based on this division. A similar dividing scheme can be used for the other regions in the layout 100, with comparisons of other junctions being made to the body-drain junction 114.

At least one of the regions in the drain 106 could have a parasitic bipolar transistor in it. In the embodiment of FIG. 2, models for regions 3–6 are selected to each have a parasitic bipolar transistor in them, while models for regions 7–9 do not. While seven drain regions 3–9 were identified in FIG. 2, fewer or more than seven regions could be identified instead.

The body tie 108 has regions 10–12 associated with it. The models selected for regions 10–12 should have no parasitic bipolar transistors in them. Region 12 may be ignored, due to its close proximity to the source 102 (photocurrent resulting from an ion strike would be discharged to ground). Fewer or more than three regions could be assigned in the body tie 108.

The contact 110 and the oxide 112 preferably do not have any assigned regions or associated models.

When a heavy ion strikes a circuit, a charge cloud is created. In the short time after the strike, the cloud expands and may eventually collide with a p-n junction in the circuit. This can create an external current that can upset a memory cell or other circuitry. The following articles provide further details on this concept and are hereby incorporated by reference herein: (1) Fulkerson et al., "A Charge-Control SPICE Engineering Model for the Parasitic Bipolar Transistor Action in SOI CMOS Single-Event Upsets," *IEEE Trans. on Nuclear Science*, Vol. 51, No. 1, Feb. 2004, pp. 275–2871; (2) Dodd et al., "SEU-Sensitive Volumes in Bulk and SOI SRAMS from First-Principles Calculations and Experiments," *IEEE Trans. on Nuclear Science*, Vol. 48, No. 6, Dec. 2001, pp. 1893–1903; (3) Edmonds, "A Time-Dependent Charge-Collection Efficiency for Diffusion," *IEEE Transactions on Nuclear Science*, Vol. 48, No. 5, Oct. 2001, pp. 1609–1615.

For example, the external current caused by a charge cloud's collision with a p-n junction in a p-type region of an n-channel MOS transistor can be described by the following equations:

$$I_1(t) = \frac{12Q}{t_1}\left[\exp\left(-3\frac{t}{t_1}\right) - \exp\left(-4\frac{t}{t_1}\right)\right] \quad (1)$$

$$t_1 = \frac{x_s^2}{D_n} \quad (2)$$

where Q is the total deposited charge, $t_1$ is the time between the strike and the charge cloud's collision with the p-n junction, $x_s$, is the distance from the drain of the MOSFET transistor to the strike location, and $D_n$, is the diffusion constant. Equations (1) and (2) provide a good approximation of the external current when $x_s$ is less than about half the distance between the drain and the p-n junction (or ohmic contact). For larger values of $x_s$, the external current will be approximately zero. Equations (1) and (2) are high-injection curve-fit approximations of numerically integrated transport equations for electrons in p-type material.

The individual contributions of layout regions can be modeled by circuit components. Once an appropriate model is selected, a circuit simulation software package (e.g. SPICE) can be used to determine the magnitude of an ion charge Q necessary to upset the circuit (e.g. upset a memory cell). As was briefly discussed with respect to FIG. 2, the circuit components may, in certain cases, include one or more parasitic bipolar junction transistors.

Figure 3:
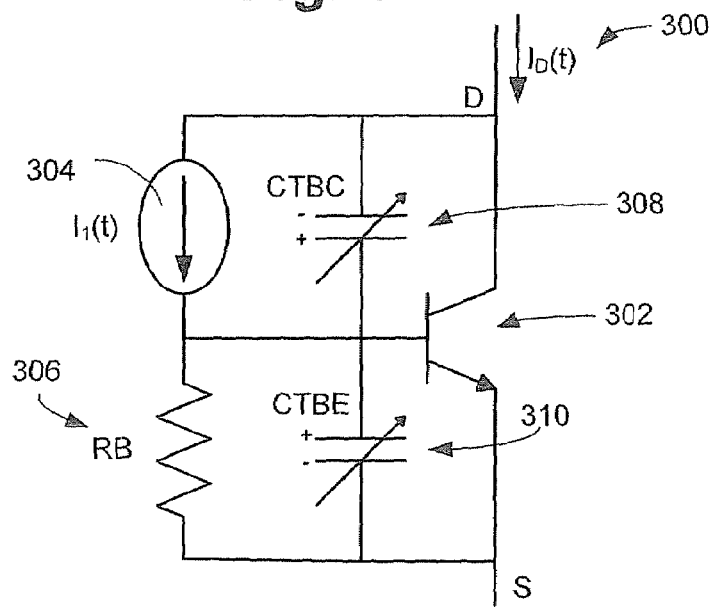
FIG. 3 is a schematic diagram of a circuit that may be used to model one or more regions of the MOSFET shown in FIGS. 1 and 2.

FIG. 3 is a schematic diagram of a circuit 300 that may be used to model the effect on drain current for the MOSFET 100 shown in FIGS. 1 and 2. The circuit 300 may be used to model one or more of the regions (e.g. regions 3–6) shown in FIG. 2. The circuit 300 includes a bipolar junction transistor (BJT) 302, a current source 304, a base resistor RB 306, a first variable capacitor CTBC 308 (corresponding to base-to-collector capacitance), and a second variable capacitor CTBE 310 (corresponding to base-to-emitter capacitance). The current source 304 provides the current $I_1(t)$ described by equations (1) and (2).

The BJT in the circuit 300 would be an NPN BJT having its emitter tied to the source of the MOSFET, its base tied to the region under the gate of the MOSFET, and its collector tied to the drain of the MOSFET. The current source 304 is placed between the drain of the MOSFET and base of the BJT. A PNP BJT could be used to model a p-channel MOSFET.

The one-dimensional equations and models described above may be used for general analysis of a circuit's behavior in response to a heavy ion strike. More expensive and more time-consuming two-dimensional or three-dimensional simulations may be useful to verify results obtained by the one-dimensional equations and models. The equations and models set forth above accurately predicted experimental SEU behavior of a non-radiation-hardened SRAM cell like the one shown in FIG. 4, which was built using a Silicon-On-Insulator (SOI) process having the following parameters:

| Parameter | Value |
| --- | --- |
| Gate oxide thickness | 8 nm |
| N threshold voltage | 0.7 V |
| P threshold voltage | 0.8 V |
| Drawn gate length | 0.35 µm |
| Si thickness | 0.22 µm |
| Average body doping under gate, n-channel | $3 \times 10^{17}/cm^3$ |
| Average body tie doping, n-channel | $2 \times 10^{18}/cm^3$ |
| Average body doping under gate, p-channel | $1 \times 10^{17}/cm^3$ |
| Average body tie doping, p-channel | $1.5 \times 10^{17}/cm^3$ |
| Average source/drain doping, n- and p-channel | $5 \times 10^{19}/cm^3$ |

Figure 4:
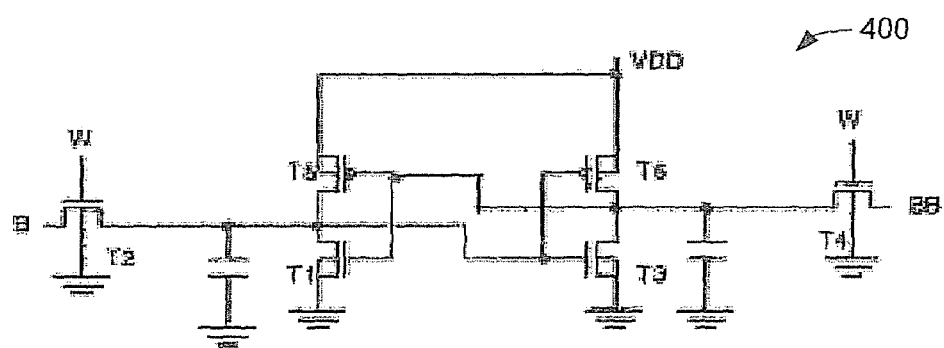
FIG. 4 is a schematic diagram of a 6-transistor SRAM cell, to which the principles set forth herein may be applied to determine sensitivity to a heavy ion strike.

Analyzing a layout corresponding to a larger circuit, such as the one shown in FIG. 4, using the principles taught herein involves identifying regions of different sensitivity (using the guidelines set forth above) and then assigning an appropriate model to the region (e.g. parasitic BJT or no parasitic BJT).

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for modeling a circuit layout to determine behavior responsive to a radiation event, the method comprising:

identifying a first portion of the circuit layout that includes at least one body region of a MOS transistor in the circuit layout, the at least one body region having a width substantially equal to that of the MOS transistor;

selecting at least one first model corresponding to the first portion of the circuit layout;

identifying a second portion of the circuit layout that includes at least a first region within a drain of the MOS transistor in the circuit layout; and selecting at least one second model corresponding to the second portion of the circuit layout, wherein the at least one second model includes at least one parasitic bipolar transistor.

2. The method of claim 1, further comprising determining a photo-current resulting from a radiation event using at least the first and second models.

3. The method of claim 1, further comprising:

identifying a third portion of the circuit layout that includes at least one region at a body tie of the MOS transistor in the circuit layout; and selecting at least one third model corresponding to the third portion of the circuit layout, wherein the at least one third model does not include any parasitic bipolar transistors.

4. The method of claim 3, further comprising determining a photo-current resulting from a radiation event using at least the first, second, and third models.

5. The method of claim 1, further comprising:

identifying a fourth portion of the circuit layout that includes at least a second region within the drain of the MOS transistor in the circuit layout;

selecting at least one fourth model corresponding to the fourth portion, wherein the at least one fourth model does not include any parasitic bipolar transistors.

6. The method of claim 5, wherein the circuit layout comprises a plurality of junctions including at least a body-drain junction and a body tie-drain junction, and wherein the second and fourth portions are selected so that an ion strike in the second portion would be closer to the body-drain junction than to the body tie-drain junction and an ion strike in the fourth portion would be closer to the body tie-drain junction than to the body-drain junction.

* * * * *